US010224867B2

(12) United States Patent
Bertelo et al.

(10) Patent No.: US 10,224,867 B2
(45) Date of Patent: Mar. 5, 2019

(54) NANODIAMOND COATINGS FOR SOLAR CELLS

(71) Applicant: Arkema Inc., King of Prussia, PA (US)

(72) Inventors: Christopher A. Bertelo, Doylestown, PA (US); Scott R. Gaboury, Blue Bell, PA (US); Ronald H. Partridge, Royersford, PA (US)

(73) Assignee: Arkema Inc., King of Prussia, PA (US)

( * ) Notice: Subject to any disclaimer, the term of this patent is extended or adjusted under 35 U.S.C. 154(b) by 165 days.

(21) Appl. No.: 15/022,988

(22) PCT Filed: Sep. 23, 2014

(86) PCT No.: PCT/US2014/056897
§ 371 (c)(1),
(2) Date: Mar. 18, 2016

(87) PCT Pub. No.: WO2015/042555
PCT Pub. Date: Mar. 26, 2015

(65) Prior Publication Data
US 2016/0233825 A1  Aug. 11, 2016

Related U.S. Application Data

(60) Provisional application No. 61/881,088, filed on Sep. 23, 2013.

(51) Int. Cl.
C08K 3/04 (2006.01)
C09D 7/65 (2018.01)
C09D 7/61 (2018.01)
C09D 5/00 (2006.01)
C09D 127/12 (2006.01)
H02S 40/22 (2014.01)
H01L 31/0216 (2014.01)
H01L 31/054 (2014.01)
B05D 3/00 (2006.01)
H01L 31/048 (2014.01)

(52) U.S. Cl.
CPC ............. *H02S 40/22* (2014.12); *B05D 3/007* (2013.01); *C09D 5/00* (2013.01); *C09D 7/61* (2018.01); *C09D 7/65* (2018.01); *C09D 127/12* (2013.01); *H01L 31/02168* (2013.01); *H01L 31/0488* (2013.01); *H01L 31/054* (2014.12); *H01L 31/0543* (2014.12); *C08K 3/04* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 7,745,831 B2 | 6/2010 | Sung | |
| 8,070,988 B2 | 12/2011 | Shenderova et al. | |
| 8,889,316 B2 | 11/2014 | Meredith, III et al. | |
| 8,911,818 B2 | 12/2014 | Castellano | |
| 2006/0269467 A1 | 11/2006 | Khabashesku et al. | |
| 2007/0126312 A1 | 6/2007 | Sung | |
| 2008/0264476 A1 | 10/2008 | Sharps et al. | |
| 2010/0147369 A1 | 6/2010 | Sung | |
| 2010/0233371 A1* | 9/2010 | Kim ...................... | B05D 5/083 427/290 |
| 2010/0285303 A1 | 11/2010 | Wu | |
| 2012/0027924 A1* | 2/2012 | Castellano ............. | B82Y 30/00 427/74 |
| 2012/0312353 A1 | 12/2012 | Kusterer et al. | |
| 2014/0158185 A1* | 6/2014 | Lefebvre ................ | B32B 5/022 136/251 |

FOREIGN PATENT DOCUMENTS

WO  WO 2008/111789 A1  9/2008

* cited by examiner

Primary Examiner — Sheeba Ahmed
(74) Attorney, Agent, or Firm — Lynn B. Morreale

(57) ABSTRACT

A nanodiamond coating for use on a solar cell, the coating including a nanodiamond material suspended in a liquid, wherein the nanodiamond material has a size range from about 1 nm to about 10 nm. Methods for improving the efficiency of a solar cell are provided, including, mixing a nanodiamond material with a liquid polymer or non-polymer solvent to form a nanodiamond-polymer suspension, forming a coating of the suspension on a top surface of a solar cell, and drying the coating such that a dried nanodiamond-polymer layer remains bonded to the solar cell. Useful nanodiamond coating compositions may include a nanodiamond material, a fluoropolymer, a liquid solvent for the fluoro-polymer and at least one additive selected from the group consisting of dispersing agents, adhesion promoters, and coupling agents. The fluoropolymer may also be used in the form of an aqueous dispersion.

14 Claims, 5 Drawing Sheets

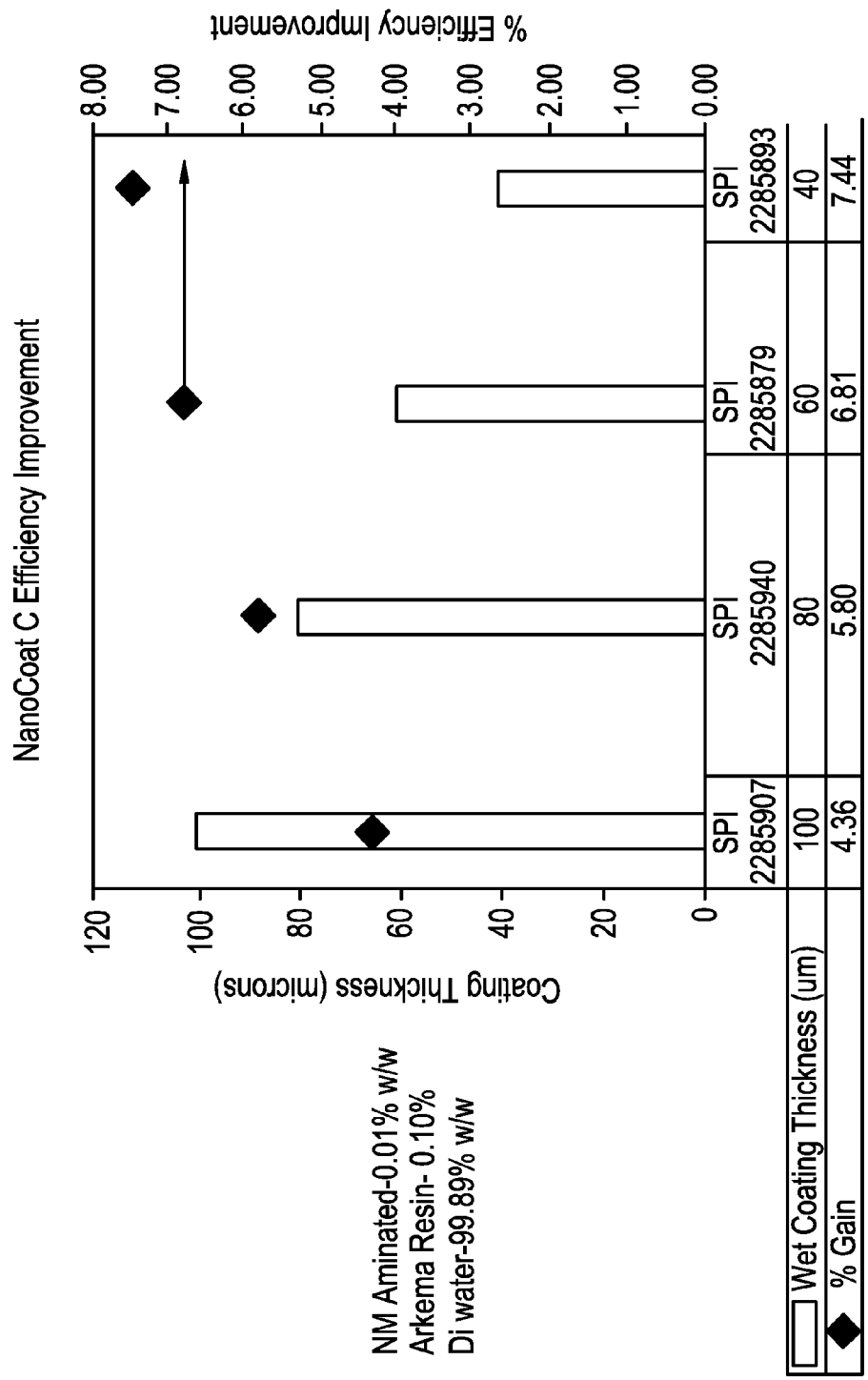

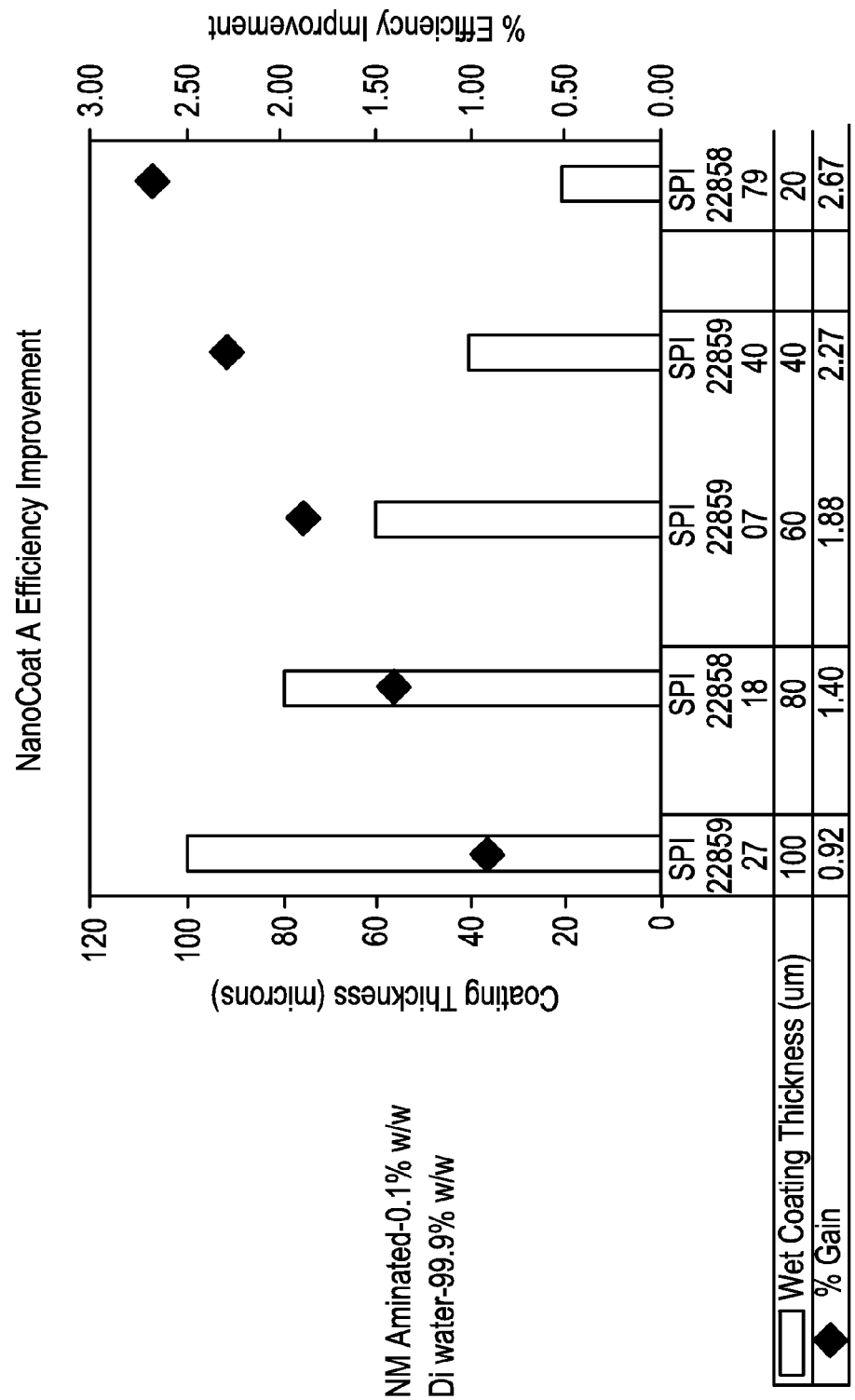

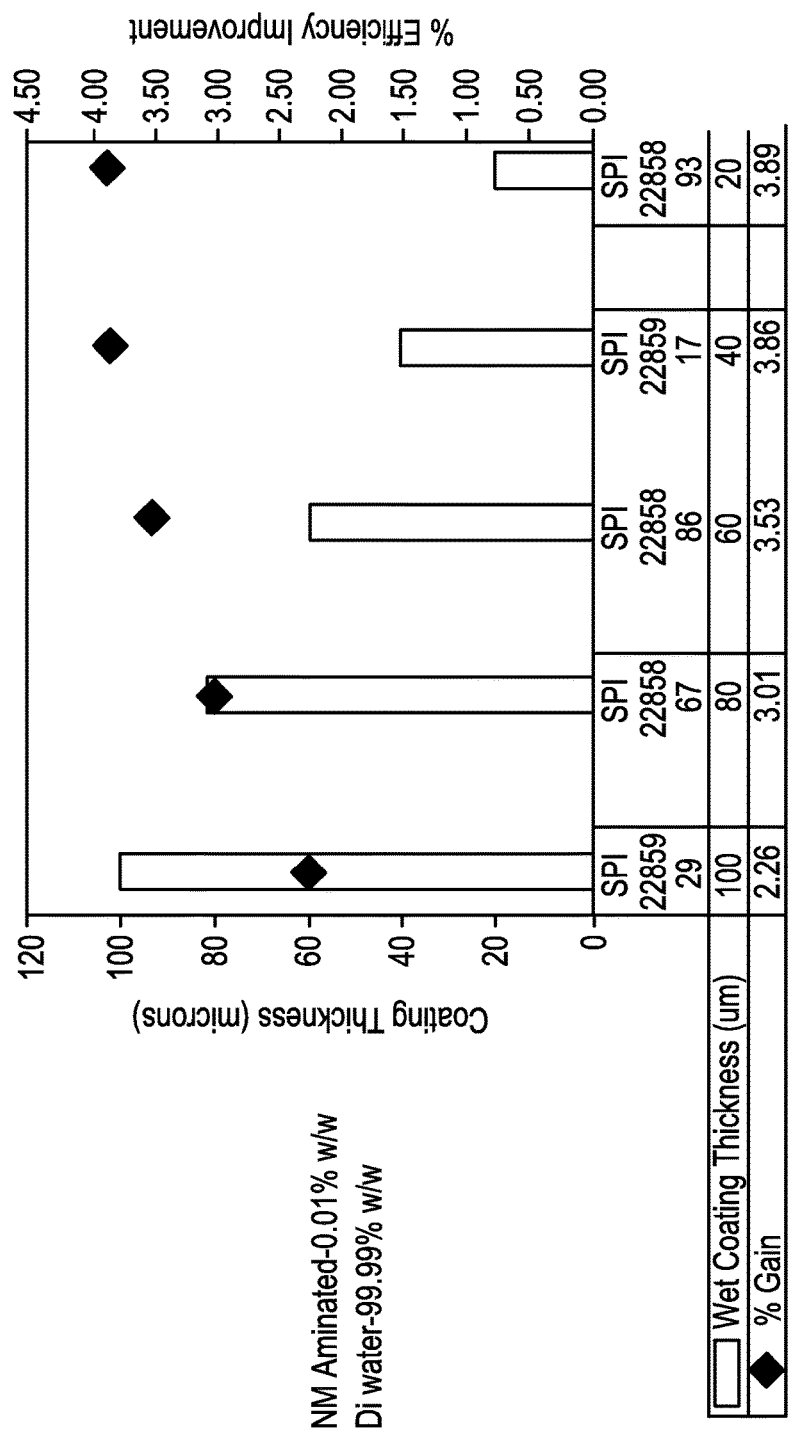

NANODIAMOND COATINGS FOR SOLAR CELLS

CROSS-REFERENCE TO RELATED APPLICATIONS

This application is a national stage application under 35 U.S.C. § 371 of PCT/US2014/056897, filed Sep. 23, 2014, which claims benefit to U.S. patent application Ser. No. 61/881,088, filed Sep. 23, 2013.

BACKGROUND

Conventional photovoltaic solar cells typically have a conversion efficiency from solar radiation to electricity of not much greater than about 15%. While a large portion of the inefficiency of a solar cell is due to quantum efficiency limitation, i.e., the percentage of incident-radiation that a photovoltaic material can convert into electricity by creating an electron-hole pair in the photovoltaic material of the solar cell, some of the inefficiency is due to reflection of incident radiation as well as the sub-optimal angle of incidence of radiation reaching the photovoltaic material. Therefore, significant improvements in the efficiency of a solar cell may be possible by decreasing the reflection of incident radiation and by improving the angle of incidence of radiation that approaches the solar cell at a sub-optimal angle.

Further improvements in the efficiency of a solar cell may also be achievable by modifying such cells so as to result in a fluorescent shift of light from a wavelength that has low efficiency to a wavelength having higher efficiency.

A process for making a conventional solar cell includes the steps of cell processing, wafer inspection, texture etch, diffusion, PSG Etch, AR Coating PECVC, metallization and passing through a co-firing furnace. Silicon wafers are cleaned with industrial soaps and then etched using hot sodium hydroxide to remove saw damage. The wafers are further etched in a hot solution of sodium hydroxide and isopropanol to form square-based pyramids; this etching step is sometimes called texturization. Texturization helps reduce the reflection of sunlight. Left untreated, the surface of a photovoltaic cell can act like a minor, reflecting more than 30% of the light that strikes it.

Since the wafers are pre-doped with boron (p-type), an n-type material is diffused into the wafer, to achieve n-p junction. Phosphorus is a common diffusant, and diffusion of phosphorus is achieved by subjecting the wafers at high temperature to a phosphorous source. However, deposited phosphosilicate glass may form during the diffusion process, and must be removed.

To further reduce the surface reflection of incident light, an anti-reflection coating (ARC) including a material such as silicon nitride or titanium oxide is applied on the surface. Anti-reflection coatings increase the amount of light coupled into the solar cell. Silicon nitride has gradually replaced titanium dioxide as a preferred anti-reflection coating because of its excellent surface passivation qualities, which prevent carrier recombination at the surface of the solar cell.

Silver is the most widely used metal for contact formation with the silicon-based photovoltaic cell, due to its solderability. Silver in the form of a paste is screen-printed onto the front and the rear of the cell. In addition, aluminum paste is also used onto the rear to achieve a Back Surface Field (BSF), which improves the performance of the solar cell. The paste is then fired at several hundred degrees Celsius to form metal electrodes in ohmic contact with the silicon.

A typical silicon solar cell reflects about one-third of the incident light that could potentially be converted into electricity.

BRIEF SUMMARY OF THE INVENTION

An embodiment of nanodiamond coating is described for use on a solar cell or other substrate such as a glass substrate, a silicon substrate or a polymeric substrate. The coating includes a nanodiamond material suspended in a liquid, wherein the nanodiamond material has a size range from about 1 nm to about 10 nm. The liquid may include a non-polymer solvent, a polymer solvent, a solid polymer dissolved in a liquid solvent, or particles of a solid polymer suspended or dispersed in a liquid medium such as water.

An embodiment of a method is described for improving the efficiency of a solar cell. The method includes mixing a nanodiamond material with a liquid medium containing a polymer to form a nanodiamond-polymer suspension, coating the suspension on a top surface of a solar cell, and drying the suspension such that a dried nanodiamond-polymer layer remains bonded to the solar cell.

Another method is described for improving the efficiency of a solar cell. The method includes suspending a nanodiamond material with a non-polymer solvent to form a suspension, coating the suspension on a top surface of a photovoltaic material within the solar cell, and drying the coating such that a dried nanodiamond layer remains bonded to the photovoltaic material.

The invention also provides a nanodiamond coating composition, wherein the nanodiamond coating composition is comprised of a nanodiamond material, a fluoropolymer, a liquid solvent for the fluoropolymer and an additive selected from the group consisting of dispersing agents, adhesion promoters, and coupling agents and combinations thereof. The nanodiamond coating composition is useful for forming a nanodiamond coating on a solar cell or on a surface of a glass sheet that is part of a photovoltaic module containing one or more solar cells.

A nanodiamond coating composition is also provided by the present invention, wherein the nanodiamond coating composition is comprised of a nanodiamond material and an aqueous emulsion or dispersion of a fluoropolymer. The nanodiamond coating composition is useful for forming a nanodiamond coating on a solar cell or on a surface of a glass sheet that is part of a photovoltaic module containing one or more solar cells.

Also provided by the present invention is a film having a nanodiamond coating on at least one side, wherein the nanodiamond coating is comprised of a nanodiamond material and a fluoropolymer. The nanodiamond-coated film may be applied to a top surface of a solar cell or a surface of a glass sheet that covers a photovoltatic module.

The invention also provides a photovoltaic module comprising one or more solar cells overlaid with a glass sheet having an outer surface, wherein the outer surface is coated with a nanodiamond coating comprised of a fluoropolymer and a nanodiamond material

BRIEF DESCRIPTION OF THE FIGURES

The foregoing summary, as well as the following detailed description of the embodiments, will be better understood when read in conjunction with the appended drawings. For the purpose of illustration, there are shown in the, drawings some embodiments which may be preferable. It should be understood, however, that the embodiments depicted are not limited to the precise arrangements and instrumentalities shown.

FIG. 3A is a graph showing the efficient of a solar cell as a function of an outer nanodiamond coating thickness.

FIGS. 3B and 3C are graphs showing the efficiency of solar cells as a function of an inner nanodiamond coating thickness.

DETAILED DESCRIPTION OF THE INVENTION

Figure 1:
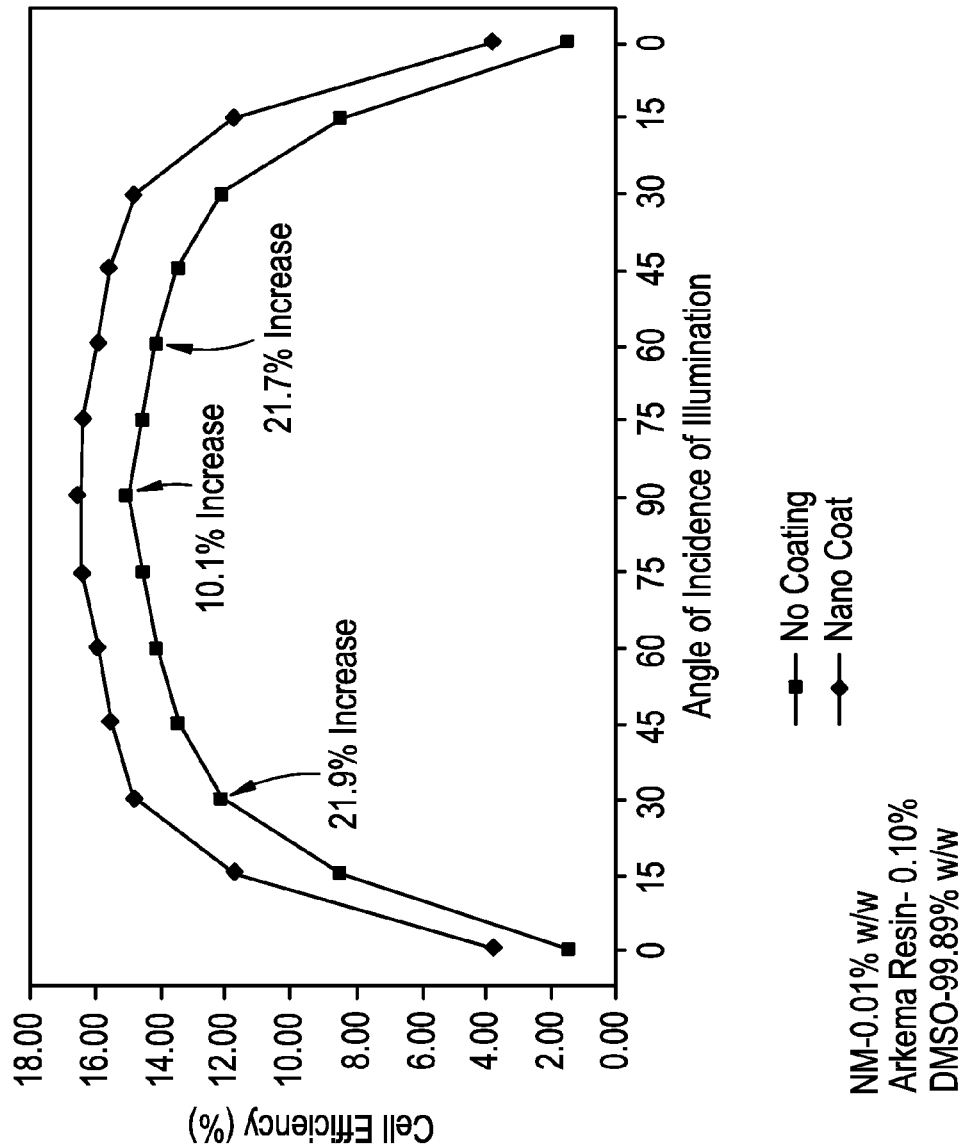
FIG. 1 is a graph comparing the efficiency of a solar cell including an outer nanodiamond coating with the efficiency of a standard solar cell without an outer nanodiamond coating, as a function of angle of sunlight incidence.

Solar cells are often electrically connected and encapsulated as a module. Photovoltaic modules often have a sheet of glass on the front (sun up) side, allowing light to pass while protecting the semiconductor wafers from abrasion and impact due to wind-driven debris, rain, hail, etc.

As disclosed herein, improvements in the efficiency of a solar cell can be obtained by forming an outer nanodiamond coating on a top surface of the solar cell, by incorporating an inner nanodiamond coating into the solar cell on top of the photovoltaic material, or by a combination of the two coatings. Additionally or alternatively, the efficiency of a solar cell may also be improved by placing a nanodiamond coating on the outer surface of a sheet of glass used to cover a photovoltaic module comprised of one or more solar cells. The nanodiamond particles are preferably of a round or irregular shape having an average diameter of less than or equal to about 0.1 micron (100 nanometers). Most of the particles preferably have a size between about 1 nm and about 10 nm, and are more preferably between about 5 nm and about 7 nm. The nanodiamond particles can be formed by a process as disclosed in U.S. Pat. Nos. 5,861,349 or 5,916,955, each of which is incorporated by reference herein in its entirety for all purposes.

The nanodiamond particles may each include a mechanically stable, chemically inert core and a chemically active surface. By functionalizing the nanodiamond particle surface with targeted species, the nanodiamond can be provided with specified chemical, physical, and electronic properties. Functionalization can be done by various chemical, photochemical, and electrochemical methods to graft different organic functionalities onto the nanodiamond. Depending on the desired physical property and application of the nanodiamond, functionalized nanodiamond materials can be fluorinated, chlorinated, carboxylated, aminated, hydroxylated, and/or sulfonated. In the testing described herein, aminated nanodiamond particles were used, but any other type of functionalized nanodiamonds could alternatively be used.

Outer Nanomaterial Coating.

An exemplary process of making a solar cell having an outer nanodiamond coating includes the steps of cell processing, wafer inspection, texture etch, diffusion, PSG Etch, AR Coating PECVD, metallization, passing through a cofiring furnace and applying a nanocoat overcoat. In particular, after a solar cell has been manufactured according to a conventional process, an outer coating is formed on the top surface of the solar cell. The outer nanodiamond coating is formed from a mixture of nanodiamond particles and a binder or matrix material that is capable of creating a substantially uniform distribution of nanodiamond particles, such as a liquid polymer or a solution of a polymer in a liquid solvent that can be spread in a thin layer and dried.

The coating composition comprising nanodiamond particles suspended in a matrix material (e.g., a polymer dissolved in a solvent) may be applied to the top surface of the solar cell by various methods. A manual blade method has been used to obtain a substantially uniform coating, by first applying the suspension to the top surface of the solar cell and then drawing a blade across the suspension to form the suspension to a desired thickness. Other techniques may also be-used to obtain a uniform coating, including but not limited to screen printing of the suspension and dip-coating of the suspension. In some cases, and in particular for coating an amorphous Si substrate, spray coating may be used. Regardless the method of application, the suspension is then dried to a film coating by allowing or encouraging the evaporation of volatile components in the suspension, such as the solvent present in a solution of a PVDF resin.

The polymer to be utilized in the nanodiamond coatings of the present invention may be a fluoropolymer or blend of different fluoropolymers, for example. The term "fluoromonomer" or the expression "fluorinated monomer" as used herein means a polymerizable alkene which contains at least one fluorine atom, fluoroalkyl group, or fluoroalkoxy group attached to the double bond of the alkene that undergoes polymerization. The term "fluoropolymer" as used herein means a polymer formed by the polymerization of at least one fluoromonomer, and it is inclusive of homopolymers, copolymers, terpolymers and higher polymers which are thermoplastic in their nature, meaning they are capable of being formed into useful pieces by flowing upon the application of heat, such as is done in molding and extrusion processes. Fluoropolymers useful in the present invention include those that are melt proces sable. Some examples of fluoropolymers that are melt proces sable include, but are not limited to polyvinylidene fluoride and copolymers of vinylidene fluoride (PVDF and co-PVDF), ethylene tetrafluoroethylene (ETFE) polymers, ethylene chlorotrifluoroethylene (ECTFE) polymers, fluorinated ethylene propylene (FEP) polymers, tetrafluoroethylene-perfluorovinyl propyl ether (PFA) polymers, and copolymers obtained by copolymerization of any combination of monomers where at least one of them is fluorinated. These could also include EFEP (ethylene, hexafluoropropylene, tetrafluoroethylene) polymers, PVDF copolymerized with hexafluoropropylene, perfluorovinyl methyl or propyl ether, ethylene, tetrafluoroethylene, vinyl fluoride, vinyl trifluoride, ethylene, etc., as well as functional monomers such as maleic anhydride, glycidyl methacrylate, etc. Other fluoropolymers potentially useful in the present invention include, but are not limited to, propylene chlorotrifluoroethylene (PCTFE) polymers, polytetrafluoroethylene (PTFE) and polyvinyl fluoride (PVF).

Particular fluoropolymers useful in the present invention include the homopolymers made by polymerizing vinylidene fluoride (VDF), and copolymers, terpolymers and higher polymers of vinylidene fluoride wherein the vinylidene fluoride units comprise greater than 70 percent of the total weight of all the monomer units in the polymer, and in one embodiment, comprise greater than 75 percent of the total weight of the units. Copolymers, terpolymers and higher polymers of vinylidene fluoride may be made by reacting vinylidene fluoride with one or more monomers from the group consisting of vinyl fluoride, trifluoroethene, tetrafluoroethene, one or more of partly or fully fluorinated alpha-olefins such as 3,3,3-trifluoro-1-propene, 1,2,3,3,3-pentafluoropropene, 3,3,3,4,4-pentafluoro-1-butene, and hexafluoropropene, the partly fluorinated olefin hexafluoroisobutylene, perfluorinated vinyl ethers, such as perfluoromethyl vinyl ether, perfluoroethyl vinyl ether, perfluoro-n-propyl vinyl ether, and perfluoro-2-propoxypropyl vinyl ether, fluorinated dioxides, such as perfluoro(1,3-dioxole) and perfluoro(2,2-dimethyl-1,3-dioxole), allylic, partly fluorinated allylic, or fluorinated allylic monomers, such as 2-hydroxyethyl allyl ether or 3-allyloxypropanediol, and ethene or propene. Preferred copolymers or terpolymers are formed with vinyl fluoride, trifluoroethene, tetrafluoroethene (TFE), and hexafluoropropene (HFP).

Particularly suitable copolymers are copolymers of VDF comprising from about 71 to about 99 weight percent VDF, and correspondingly from about 1 to about 29 percent TFE; from about 71 to 99 weight percent VDF, and correspondingly from about 1 to 29 percent HFP (such as those disclosed in U.S. Pat. No. 3,178,399); and from about 71 to 99 weight percent VDF, and correspondingly from about 1 to 29 weight percent trifluoroethylene.

Particularly suitable terpolymers are the terpolymers of VDF, HFP and TFE, and the terpolymers of VDF, trifluoroethene, and TFE. In one embodiment, the terpolymers have at least 71 weight percent VDF, and the other comonomers may be present in varying portions, but together they comprise up to 29 weight percent of the terpolymer.

The use of fluoropolymers which are copolymers of vinylidene fluoride with one or more comonomers may be advantageous in certain embodiments of the invention, as such copolymers, terpolymers and so forth may have reduced melting points, greater solubility, greater clarity, and/or reduced crystallinity as compared to polyvinylidene fluoride homopolymers.

The polyvinylidene fluoride could also be a functionalized PVDF, produced by either copolymerization or by post-polymerization functionalization, such as KYNAR ADX from Arkema Inc. with grafted maleic anhydride functionality. KYNAR ADX could be a blend or pure grafted polymer.

The fluoropolymer may be crosslinked or non-crosslinked. Mixtures of different fluoropolymers may be utilized.

The molecular weight of the fluoropolymer, for purposes of the present invention, may be measured by the melt viscosity. Typically, the melt viscosity of the fluoropolymer is in the range of from about 1 to about 50 (as measured by ASTM D3825; 450° F.; K Poise @ 100 sec$^{-1}$), preferably from about 2 to about 25. For example, in one embodiment the fluoropolymer has a melt viscosity in the range of from about 5 to about 16 (as measured by ASTM D3825; 450° F.; K Poise @ 100 sec$^{-1}$).

In one aspect of the invention, the fluoropolymer component of the nanodiamond coating composition is in the form of an aqueous dispersion. That is, the fluoropolymer may be supplied to the nanodiamond coating composition in the form of a dispersion of fluoropolymer particles in water. The particle size of the fluoropolymer may advantageously be less than about 500 nm, preferably less than about 400 nm, even more preferably less than about 300 nm, for example, as smaller particle sizes generally tend to facilitate the formation of stable dispersions. One or more surfactants may be present in such aqueous dispersions. In one embodiment the aqueous dispersion of fluoropolymer is free of fluoro-surfactant. Methods of making aqueous fluoropolymer dispersions are well known in the art and are described, for example, in the following U.S. Patent Publications, each of which is incorporated herein by reference in its entirety for all purposes: 2013/0122309; 2013/0079461; and 2012/0142858.

Prior to application of a nanodiamond coating composition in accordance with the present invention, the surface of the substrate to which the composition is to be applied (e.g., the top surface of a solar cell or the top surface of a glass sheet used to cover a solar cell) may be subjected to a chemical or physical treatment to modify the substrate surface, for example, through the introduction of functional groups which help to improve the adhesion of the nanodiamond coating to the substrate surface. Such pretreatment methods include, but are not limited to, chemical vapor deposition, plasma or corona treatment, treatment with a coupling agent (e.g., a silane), and the like and combinations thereof.

In several embodiments, polyvinylidine fluoride (PVDF) resin sold under the brand name, Kynar® by Arkema, Inc. was used as the polymer matrix material. A nanodiamond material was blended into a liquid PVDF material (i.e., a PVDF solution) for coating on a solar cell. In one example, a suspension was made including 0.01% w/w nanodiamond particles, 0.1% w/w of PVDF resin, and the balance dimethyl sulfoxide (DMSO). A coating of the suspension was applied to the top-surface of the solar cell and allowed to dry, leaving the nanodiamond particles suspended in a film of PVDF polymer in a narrow band of distances above the top surface of the solar cell. Coatings were tested having thickness from about 40 microns to about 100 microns, and the resulting change in efficiency of the solar cell was measured. As shown in FIG. 3A, efficiency improvement in the solar cell was inversely proportional to wet coating thickness, with a 100 micron coating achieving more than a 4% increase in efficiency and a 40 micron coating achieving a nearly 7.5% increase in efficiency.

Other compositions of coatings have been tested, varying the concentration of nanodiamond particles and PVDF resin in the suspension, and efficiency improvements in excess of 10% have been achieved with 0.01% w/w nanodiamond particles and 0.1% w/w PVDF resin. An 11.5% increase in efficiency was obtained between a solar cell prior to coating having an efficiency of 15.4% and the same solar cell after an outer coating of nanodiamond particles was applied having an efficiency of 17.2%.

The weight ratio of nanodiamond particles to fluoropolymer in the coating composition may vary, but typically may be in the range of from about 0.0001:1 to about 0.2:1.

The concentration of nanodiamond particles in the nanodiamond coating composition and the thickness of the nanodiamond coating composition (after drying the composition to remove any solvent which may be present) may be adjusted as needed to achieve the desired coverage of nanodiamond particles on the substrate surface. For example, the nanodiamond particles may be present on the substrate surface at a concentration of from about $10^{-8}$ to about $10^{-6}$ g/m$^2$. Although the thickness of the dried nanodiamond coating composition layer is not believed to be critical, thicker coatings may tend to be more durable and weather-resistant. Exemplary suitable dry coating thicknesses may, for example, be from about 1 to about 100 microns.

The components of the nanodiamond coating composition should generally be selected so as to provide a nanodiamond-containing coating on a substrate which is optically clear, UV stable and UV transparent.

Generally speaking, it will be desirable to provide a nanodiamond coating composition which is in the form of a suspension, wherein the nanodiamond particles are suspended in a liquid medium such as water or a liquid organic solvent or mixture of liquid organic solvents, as this will facilitate handling and processing of the nanodiamond coating composition and its uniform application to a substrate surface. However, the nanodiamond particles often tend to settle out of suspension unless constant agitation is applied. As the concentration of nanodiamond particles in the nanodiamond coating composition increases, it may be even more difficult to maintain the nanodiamond particles in suspension. To address this problem, the coating composition may be formulated to contain one or more dispersing agents which are effective to enhance the suspension stability of the nanodiamond particles. Any of the dispersing agents generally known in the art to function as disperants for inorganic particles may be utilized. In one embodiment, the dispersing agent is a polymer, which may contain one or more different types of functional groups pendant to the backbone of the polymer. For example, the dispersing agent may be an acrylic polymer, in particular a functionalized acrylic polymer. The functional groups of the acrylic polymer may be selected to be complementary to any functional groups present on the surface of the nanodiamond particles.

Acrylic polymers (also referred to as acrylic resins) are polymers prepared by the polymerization of one or more acrylic monomers such as acrylic acid, methacrylic acid, alkyl (meth)acrylates such as methyl methacrylate and ethyl acrylate as well as polymers prepared by the copolymerization of one or more acrylic monomers and one or more non-acrylic monomers such as olefins, vinyl aromatic monomers (e.g., styrene), and the like. Functional groups pendant to the backbone of the acrylic polymer may be introduced through the use of functionalized monomers as well as by chemical modification of the acrylic polymer after polymerization. Suitable illustrative functional groups include, but are not limited to, ureido, carboxylic acid, sulfonic acid, aziridine, amine, isocyanate, melamine, epoxy, hydroxyl, anhydride and the like and combinations thereof. In one embodiment of the invention, the acrylic polymer is soluble in the solvent employed to solubilize the fluoropolymer in the nanodiamond coating composition. In the embodiment of the invention where the fluoropolymer is in the form of an aqueous dispersion, the acrylic polymer may be selected such that it is soluble in the water phase of the dispersion. Alternatively, the acrylic polymer could itself be in the form of an aqueous dispersion.

The concentration of dispersing agent in the nanodiamond coating composition may be selected to be an amount effective to increase the suspension stability of the nanodiamond particles as compared to an analogous coating composition which does not contain a dispersing agent. For example, the nanodiamond coating composition may contain from about 0.5 to about 100% by weight dispersing agent, based on the weight of the nanodiamond particles present, preferably from about 1 to about 80% by weight, more preferably from about 5 to about 70% by weight.

The nanodiamond coating composition may additionally or alternatively include one or more adhesion promoters, which function to improve the adhesion between the dried film of nanodiamond coating and the surface of the substrate onto which the film is coated. Suitable adhesion promoters include polymers, such as acrylic polymers. Functionalized acrylic polymers, including those described previously in connection with the discussion of dispersing agents, may be especially suitable for use as adhesion promoters in the present invention. A particular acrylic polymer may function both as an adhesion promoter and a dispersing agent.

One or more coupling agents may be included as an additive in the nanodiamond coating composition in order to improve the adhesion or bonding of the film of the nanodiamond coating to a substrate surface (e.g., the surface of a solar cell or the surface of a glass sheet overlaying an array of solar cells in a photovoltaic module). Coupling agents are well known in the art and generally are non-polymeric ingredients; suitable coupling agents include, for example, organic silanes, aluminates, zirconates and titanates, such as for example monoalkyl titanates, trichlorosilanes, trialkoxysilanes and amine-functionalized silanes. A coupling agent may function by bonding (covalently or through other molecular interaction) to both the substrate surface and to one or more components of the nanodiamond coating.

The nanodiamond coating composition of the present invention may also be formulated with one or more additives which function to improve the dirt shedding performance of the nanodiamond coating formed on the substrate surface. A hydrophilic ingredient may be incorporated in the nanodiamond coating composition to help water wet the coating surface and improve its ability to be cleaned. Such modifications of the nanodiamond coating composition will be particularly advantageous where in the final product the nanodiamond coating forms an outer coating which is exposed to the elements, for example, where the nanodiamond coating is formed on the outer surface of a glass sheet overlaying an array of solar cells in a photovoltaic module.

The coating of the nanodiamond coating composition on the substrate surface may be surface treated to increase the surface energy of the coating and improve its dirt shedding performance. For example, plasma or corona treatment of the substrate surface may be utilized. Texture or microstructure may be included in the coating to reduce reflections due to the position of the sun relative to the coated substrate.

After a coating of a nanodiamond coating composition in accordance with the present invention has been applied to a substrate surface, one or more additional coatings (layers) of other compositions may thereafter be applied. For example, a topcoat comprised of a fluoropolymer, but no nanodiamond particles, may be formed over a coating of a nanodiamond coating composition on a substrate surface. Alternatively, the nanodiamond coating can be applied to one side of a film, such as a film comprised of PVDF, and the film applied to a solar cell or a photovoltaic module (e.g., the glass sheet covering the photovoltatic module) such that the film protects the coating containing the nanodiamonds. The film can also include an adhesive layer to assist in attaching the film to the substrate.

Without being bound by theory, it is believed that the increase in efficiency of a solar cell having an outer nanodiamond coating may result from the nanodiamond refracting sunlight reaching the solar panel. The net effect is to increase the flux of photons impinging on the photovoltaic material at normal or near normal incidence (which impart higher levels of energy onto the photovoltaic material) and to disperse the flux of photons that would otherwise impinge on the photovoltaic material at grazing angles (which impart relatively low levels of energy onto the photovoltaic material). Without wishing to be bound by theory, it is also believed that the increase in efficiency of a solar cell having an outer nanodiamond coating may be due to an increase in the effective flux of protons.

This phenomena can eliminate the need for expensive tracking systems, particularly on residential and commercial buildings, by enabling solar cells to achieve higher efficiencies at less direct angles of solar illumination. FIG. 1 shows test results for an outer nanodiamond coating made from 0.01% w/w nanodiamond particles, 0.1% w/w PVDF resin, and the balance DMSO. At an angle of sunlight incidence of 90 degrees (i.e., normal to the top surface of the solar cell, for which a conventional solar cell is most efficient), the nanodiamond outer coating increased solar cell efficiency by 10.1%. But even greater increases in efficiency were observed at angles of sunlight incidence away from normal. At a modest angle of incidence of 60 degrees (i.e., 30 degrees from normal), an efficiency increase of 12.7% was observed, and at a relatively shallow angle of incidence or 30 degrees (i.e., 60 degrees from normal), an efficiency increase of 21.9% was observed.

Figure 2:
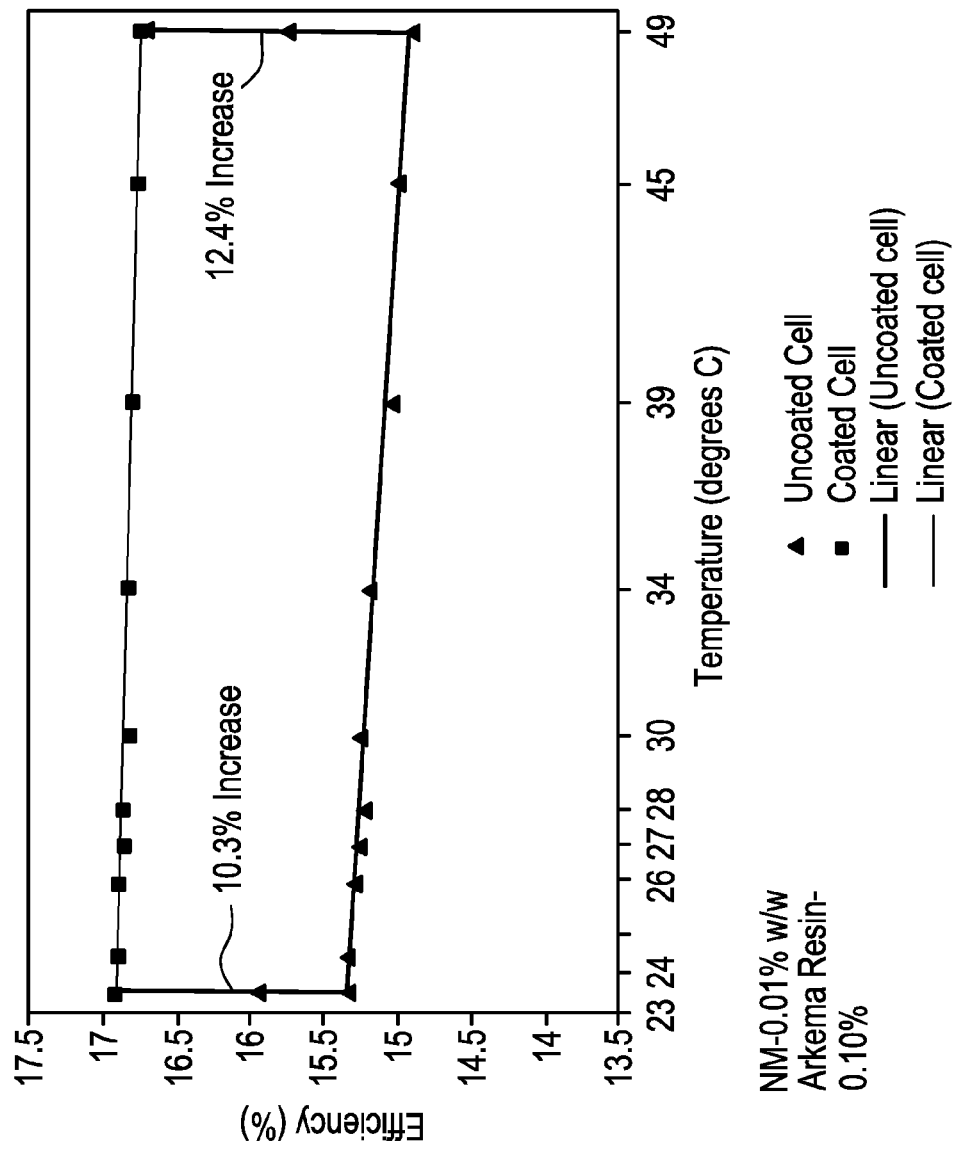
FIG. 2 is a graph comparing the efficiency of a solar cell including an outer nanodiamond coating with the efficiency of a standard solar cell without an outer nanodiamond coating, as a function of temperature.

A coated solar cell also shows improved performance due to the superior heat transfer capability of the nanodiamond particles in the coating, and this improvement increases as the temperature of the solar cell increases. Test results are shown in FIG. 2 comparing an uncoated cell and a cell coated with an outer coating including 0.01% w/w nanodiamond particles and 0.1% polymer resin. Even at 23° C. the coated cell outperformed the uncoated cell, in terms of conversion efficiency by 10.3%. At 49° C., the improvement in efficiency was 12.4%. These results are believed to be due, at least in part, to the high thermal conductivity of the nanodiamond particles particles (in the form of nanocrystals), which dissipates heat generated by the solar cell. Because heat can degrade the efficiency of a solar cell, the ability of the nanodiamond particles to dissipate heat both perpendicularly from the surface as well as laterally across the surface contributes to improvements in efficiency.

Inner Nanomaterial Coating.

An exemplary process of making a solar cell having an inner nanodiamond coating includes the steps of cell processing, silicon etch, application of a nanocoat innercoat, diffusion, PSG etch, AR Coating PECVD, metallization, and passing through a co-firing furnace. In particular, the inner nanodiamond coating is incorporated into a solar cell during manufacture of the solar cell. The inner nanodiamond coating is formed from nanodiamond particles in the absence of a binder or matrix material which might otherwise break down at the elevated temperatures to which the inner components of the solar cell will be exposed. In comparison to the conventional process, a process using the inner nanodiamond coating can be used both to improve solar cell efficiency and to decrease manufacturing costs. First, texture etching of the silicon substrate can be eliminated. In addition, the compound step of anti-reflective (AR) coating and plasma-enhanced chemical vapor deposition (PECVD) can be simplified; the step of AR coating PECVD combines hydrogen annealing and PECVD, and the PECVD portion of the step can be eliminated and replaced with applying an inner nanodiamond coating.

The performance of the inner nanodiamond coating has been found to be best when a substantially uniform monodispersed layer of nanodiamond particles can be achieved on a silicon solar cell.

Similarly to the outer coating, the inner nanodiamond coating may be applied to the top surface of the photovoltaic material by various methods, including using a manual blade method, screen printing, dip-coating, and spray coating. Alternatively, spin coating may be used. Excellent uniformity and thickness control of the coating can be achieved using blade coating, although other methods may be refined to produce similar results. To facilitate coating, the nanodiamond particles are suspended in water or a non-polymer solvent that will essentially completely evaporate once the nanodiamond particles are spread uniformly as desired. Suitable solvents include DMSO, isopropyl alcohol, tetrahydrofuran (THF) and n-methylpyrrolidone (NMP). In one embodiment, the solvent is a solvent for the fluoropolymer (i.e., the solvent is capable of dissolving the fluoropolymer). The solvent may be selected such that it is liquid at the temperature(s) at which the nanodiamond coating composition is to be coated onto the substrate. Blends of different solvents having different characteristics may be used. For example, a solvent having a relatively boiling point may be used in combination with a blend having a relatively high boiling point, so as to provide the nanodiamond coating composition with a broader evaporation (drying) profile than it would have using just one of the solvents.

The inner nanodiamond coating eliminates the need for an etching step that is conventionally used to texture the surface of the silicon substrate of a solar cell so as to scatter light and increase collection efficiency. In addition, the outer nanodiamond coating reduces the reflection of sunlight, thereby causing more photons to reach the solar cell and increasing the electrical output of the cell. This can eliminate the need for an anti-reflective coating that is often used on top of a conventional solar cell to reduce the number of reflected photons.

In testing on solar cells for which the silicon substrate had already been subjected to texture etching, efficiency improvements of over 3% have been achieved using an inner nanodiamond coating of 40 microns thickness or less (when wet). FIG. 3B shows that for a coating formulation including 0.1% w/w nanodiamond particles with the balance being DMSO, efficiency gains ranged from slightly less than 1% to more than 2.5%. Efficiency improvement for this formulation was almost directly inverse to inner coating thickness, with a wet coating thickness of 100 microns producing an efficiency improvement of 0.92% and a thickness of 20 microns producing an efficiency improvement of 2.67%. FIG. 3C shows even better results for a coating formulation including 0.01% w/w nanodiamond particles with the balance being DMSO, with maximum efficiency gains of nearly 4%. Efficiency improvement for this formulation improved generally with thinner coatings, but was about the same for coatings of 40 microns and 20 microns (3.86% and 3.89% respectively). Even at a relatively thick coating of 100 microns, an efficiency gain of 2.26% was achieved.

When both an inner nanodiamond coating and an outer nanodiamond coating are applied to a solar cell, a net improvement in efficiency results that is an aggregate of the efficiency improvements from each coating alone. Thus, the efficiency gained by texture etching and anti-reflective coating can be equaled by replacing these steps with the inner nanodiamond coating, but at a lower cost. By adding the outer nanodiamond coating, a total cell efficiency increase of up to 10% can be reliably achieved, exceeding the increase produced by texture etching and anti-reflective coating.

Glass Sheet Coating

In another embodiment of the invention, a nanodiamond coating in accordance with the invention may be formed on s surface (e.g., the outer surface) of a sheet of glass to be used to overlay and protect one or more solar cells, such as the solar cells which form part of a photovoltaic module. Such nanodiamond coatings may be formed from nanodiamond coating compositions as described in detail elsewhere herein. The surface of the glass sheet to be coated with the nanodiamond coating may be pretreated with a coupling agent or the like to facilitate adhesion of the dried nanodiamond coating. The nanodiamond coating composition to be used to form the nanodiamond coating on the glass sheet may comprise a fluoropolymer, a nanodiamond material, a solvent and, optionally, one or more additives selected from the group consisting of dispersing agents, adhesion promoters, and coupling agents. The nanodiamond coating composition may be coated onto a surface of the glass sheet (either the top (outer) surface, the bottom surface (facing the solar cell(s)) or both the top and bottom surfaces) and then dried such that a layer of the nanodiamond coating remains bonded to the surface.

Nanodiamond-Containing Films

Another aspect of the invention provides a film having a nanodiamond coating on at least one side, wherein the nanodiamond coating is comprised of a nanodiamond material and a fluoropolymer. The film substrate may, for example, be comprised of a thermoplastic such as a thermoplastic polymer (e.g., PVDF). The nanodiamond coating may be formed on the film surface using the same nanodiamond coating compositions and coating techniques described previously in connection with forming nanodiamond coatings on solar cells or a glass sheet used to cover solar cells. The preformed, coated film may be applied to a solar cell or array of solar cells or to a fully assembled photovoltaic module. The materials used in the coated film may be selected such that the film adheres to the solar cell or photovoltaic module when brought into contact with the substrate, heated and then cooled. An adhesive layer could also be used to bond the film to the substrate.

While reference has been made to specific embodiments, it is apparent that other embodiments and variations can be devised by others skilled in the art without departing from their spirit and scope. The appended claims are intended to be construed to include all such embodiments and equivalent variations.

What is claimed is:

1. A nanodiamond coating composition which is an emulsion or a suspension, wherein the nanodiamond coating composition is comprised of a nanodiamond material, a fluoropolymer, a liquid solvent for the fluoropolymer and at least one additive selected from the group consisting of dispersing agents, adhesion promoters, and coupling agents, wherein the at least one additive includes an acrylic polymer which is a functionalized acrylic polymer.

2. The nanodiamond coating composition of claim 1, wherein the functionalized acrylic polymer is comprised of one or more functional groups selected from the group consisting of hydroxyl, amino, ureido, epoxy, carboxylic acid, isocyanate, sulfonic acid, aziridine, melamine, anhydride and combinations thereof.

3. The nanodiamond coating composition of claim 1, wherein the at least one additive includes a coupling agent selected from the group consisting of silanes, titanates, zirconates and aluminates.

4. A method, comprising coating the nanodiamond coating composition of claim 1 onto a substrate and drying the nanodiamond coating composition to form a nanodiamond coating on the substrate.

5. The method of claim 4, wherein the substrate is a solar cell or a glass sheet which covers a photovoltaic module.

6. A nanodiamond coating composition, wherein the nanodiamond coating composition is comprised of a nanodiamond material and an aqueous emulsion or dispersion of a fluoropolymer, at least one additive selected from the group consisting of dispersing agents, adhesion promoters, and coupling agents, wherein the at least one additive includes an acrylic polymer.

7. The nanodiamond coating composition of claim 6, wherein the acrylic polymer is a functionalized acrylic polymer.

8. The nanodiamond coating composition of claim 7, wherein the functionalized acrylic polymer is comprised of one or more functional groups selected from the group consisting of hydroxyl, amino, ureido, epoxy, carboxylic acid, isocyanate, sulfonic acid, aziridine, melamine, anhydride and combinations thereof.

9. The nanodiamond coating composition of claim 6, wherein the at least one additive includes a coupling agent selected from the group consisting of silanes, titanates, zirconates and aluminates.

10. A method, comprising coating the nanodiamond coating composition of claim 6 onto a substrate and drying the nanodiamond coating composition to form a nanodiamond coating on the substrate.

11. The method of claim 10, wherein the substrate is a solar cell or a glass sheet which covers a photovoltaic module.

12. A film having a nanodiamond coating on at least one side, wherein the nanodiamond coating is made from the nanodiamond coating composition of claim 1.

13. A photovoltaic module, comprising one or more solar cells and a film in accordance with claim 12.

14. A photovoltaic module comprising one or more solar cells overlaid with a glass sheet having a surface, wherein the surface is coated with a nanodiamond coating film in accordance with claim 12.

* * * * *